United States Patent
Hung et al.

(10) Patent No.: US 10,110,125 B2
(45) Date of Patent: Oct. 23, 2018

(54) SYSTEM AND METHOD OF DRIVING A SWITCH CIRCUIT

(71) Applicant: Powerventure Semiconductor Limited, London (GB)

(72) Inventors: Der Ju Hung, Taoyuan (TW); Yuan Wen Hsiao, Hsinchu (TW); Chi-Chia Huang, Hsinchu (TW)

(73) Assignee: Dialog Semiconductor (UK) Limited, London (GB)

(*) Notice: Subject to any disclaimer, the term of this patent is extended or adjusted under 35 U.S.C. 154(b) by 0 days.

(21) Appl. No.: 15/590,443

(22) Filed: May 9, 2017

(65) Prior Publication Data

US 2018/0152188 A1    May 31, 2018

(30) Foreign Application Priority Data

Nov. 28, 2016 (GB) .................................. 1620104.8

(51) Int. Cl.
  *H02M 3/156* (2006.01)
  *H03K 19/0185* (2006.01)
  *G01S 7/00* (2006.01)
  *H02J 9/06* (2006.01)
  *H03K 19/0948* (2006.01)
  *H03K 19/094* (2006.01)
  *H03K 17/51* (2006.01)

(52) U.S. Cl.
  CPC ............... *H02M 3/156* (2013.01); *G01S 7/00* (2013.01); *H02J 9/06* (2013.01); *H03K 19/01855* (2013.01); *H03K 19/0948* (2013.01); *H03K 19/09429* (2013.01); *H03K 2017/515* (2013.01)

(58) Field of Classification Search
None
See application file for complete search history.

(56) References Cited

U.S. PATENT DOCUMENTS

| | | | | |
|---|---|---|---|---|
| 4,648,019 A | * | 3/1987 | Stahl | H04M 19/023 327/110 |
| 6,148,025 A | * | 11/2000 | Shirani | H03K 5/007 327/307 |
| 6,614,288 B1 | * | 9/2003 | Dagan | H03K 17/08142 327/365 |

(Continued)

OTHER PUBLICATIONS

"Design on Mixed-Voltage I/O Buffers with Slew-Rate Control in Low-Voltage CMOS Process," by Ming-Dou Ker et al., 15th IEEE International Conference on Electronics, Circuits and Systems, 2008, ICECS, Aug. 31-Sep. 3, 2008.

(Continued)

*Primary Examiner* — Yusef A Ahmed
(74) *Attorney, Agent, or Firm* — Saile Ackerman LLC; Stephen B. Ackerman

(57) ABSTRACT

A sequential driving method for driving a switch circuit of a power converter is presented. The method has the steps of driving a switch circuit which contains a power switch, defining a driving sequence; and applying sequentially an electrical parameter to the power switch, based on the driving sequence. Defining a driving sequence includes defining a plurality of different driving levels associated with the electrical parameter and defining a plurality of time windows within a switching time period. Each time window is associated with a driving level among the plurality of driving levels.

13 Claims, 10 Drawing Sheets

(56) References Cited

U.S. PATENT DOCUMENTS

| | | | | |
|---|---|---|---|---|
| 7,126,394 B2* | 10/2006 | Hargan | .................... | H03K 5/01 327/170 |
| 9,425,786 B2* | 8/2016 | Zoels | ...................... | H02M 1/08 |
| 9,444,444 B2* | 9/2016 | Fujita | .................... | H03K 17/163 |
| 9,813,055 B2* | 11/2017 | Laschek-Enders | ......................... | H03K 17/567 |
| 9,819,339 B2* | 11/2017 | Ma | ...................... | H03K 17/168 |
| 2005/0052380 A1* | 3/2005 | Landolt | ............... | G09G 3/2011 345/87 |
| 2007/0200613 A1* | 8/2007 | Ishikawa | ............ | H03K 17/0406 327/427 |
| 2008/0197903 A1* | 8/2008 | Humble | ............... | H03K 5/1565 327/175 |
| 2010/0060326 A1* | 3/2010 | Palmer | ............. | H03K 17/08148 327/109 |
| 2010/0148830 A1* | 6/2010 | Nilson | ............... | H03K 17/0828 327/108 |
| 2012/0212075 A1* | 8/2012 | Arnet | ..................... | H02M 1/08 307/113 |
| 2014/0028367 A1* | 1/2014 | Chaung | ................ | H03K 17/145 327/277 |
| 2014/0043076 A1* | 2/2014 | Hesener | .................... | H03K 7/08 327/170 |
| 2014/0049240 A1* | 2/2014 | Chen | ........................ | G05F 1/10 323/282 |
| 2015/0187314 A1* | 7/2015 | Choi | .................... | G09G 3/3677 345/99 |
| 2015/0228240 A1* | 8/2015 | Ahn | ..................... | H03K 17/284 345/213 |
| 2015/0318849 A1* | 11/2015 | Wu | ........................ | H03K 17/28 327/393 |
| 2016/0277012 A1* | 9/2016 | Abesingha | ............... | H03K 5/14 |
| 2016/0336936 A1* | 11/2016 | Ma | ....................... | H03K 17/168 |
| 2016/0380536 A1* | 12/2016 | Rowald | ................. | H02M 3/156 323/271 |
| 2017/0115717 A1* | 4/2017 | Shankar | .................... | G06F 1/28 |
| 2017/0272068 A1* | 9/2017 | Liang | ................... | H03K 17/567 |
| 2017/0288661 A1* | 10/2017 | Laschek-Enders | ........................ | H03K 17/567 |

OTHER PUBLICATIONS

AOZ1321DI "Load Switch with Controlled Slew Rate," Alpha & Omega Semiconductor, General Description, Aug. 2008, pp. 1-15, found: www.aosmd.com/res/data_sheets/AOZ1321DI.pd.

"20 mΩ, Slew Rate Controlled Load Switch in WCSP6," Vishay, SiP32458, SiP32459, Vishay Siliconix, Document No. 63999, Jun. 24, 2013, pp. 1-11.

"Reducing Ringing Through PCB Layout Techniques," by David Jauregui, Texas Insturments Application Report SLPA005—Jun. 2009, 7 pgs.

"MIPS R4000Slew Rate Control Logic for Output Buffers," by Shabbir Latif, Application Note, Publication No. AP001, Jul. 1992, 17 pgs.

"A Slew-Rate-Controlled Output Driver With One-Cycle Tuning Time," by Young-Ho Kwak et al., Asia and South Pacific Design Automation Conference, ASPDAC 2008. 21-24 Mar. 21-24, 2008, Seoul, Korea, 14 pgs.

"Design Considerations for High Step-Down Ratio Buck Converters," by Ramesh Khanna et al., pp. 1-47, PowerWise, National Semiconductor, Jan. 2008.

* cited by examiner

| | setting | | | | unit | notes |
|---|---|---|---|---|---|---|
| | 0 | 1 | 2 | 3 | | |
| DRVH_drv1_drv3 | 1 | 2 | 3 | 4 | | driving capability for Tr1,Tr3,Tf1,Tf3 |
| DRVH_drv2 | 1 | 2 | 3 | 4 | | driving capability for Tr2,Tf2 |
| DRVHr_dly1 | 0 | 2 | 4 | 6 | nS | duration Tr1 |
| DRVHr_dly2 | 3 | 6 | 9 | 12 | nS | duration Tr2 |
| DRVHr_dly3 | 0 | 10 | 20 | 30 | nS | duration Tr3 |
| DRVHf_dly1 | 0 | 2 | 4 | 6 | nS | duration Tf1 |
| DRVHf_dly2 | 3 | 6 | 9 | 12 | nS | duration Tf2 |
| DRVHf_dly3 | 5 | 10 | 15 | 20 | nS | duration Tf3 |
| DRVL_drv | 1 | 2 | 3 | 4 | | driving capability |
| DRVL_dly | 5 | 10 | 15 | 20 | nS | |

SYSTEM AND METHOD OF DRIVING A SWITCH CIRCUIT

TECHNICAL FIELD

The present disclosure relates to a system and method for driving a switch circuit. In particular, the present disclosure relates to a sequential driving method for driving a switch circuit of a power converter.

BACKGROUND

Switching power supplies such as buck or buck-boost converters operate based on the cyclic charge and discharge of an inductor. The control of the charge and discharge phase often relies on a pair of power transistors, a first transistor being used for charging the inductor and a second transistor being used for discharging it. Such systems rely on a careful timing operation of the transistors; when one transistor is open the other is closed and vice versa.

When a transistor is switched ON, a gate-source voltage of the transistor rises. Similarly, when the transistor is switched OFF, the gate-source voltage falls. Power transistors often display significant parasitic inductances and capacitances at their gate, source and drain. This can result in significant variations of the gate-source voltage during switching times and lead to the occurrence of short circuits.

To mitigate this problem, a delay also referred to as dead-time, may be introduced between the switching of the first transistor and the switching of the second transistor. In addition, one can apply a slow slew rate during the whole transient period of the transistor. Although this method can improve the noise level by reducing voltage fluctuations it also reduces efficiency by increasing the dead-time.

SUMMARY

It is an object of the invention to address one or more of the above mentioned limitations. According to a first aspect of the disclosure, there is provided a method of driving a switch circuit comprising a power switch, comprising defining a driving sequence; and applying sequentially an electrical parameter to the power switch, based on the driving sequence.

Optionally, defining a driving sequence comprises defining a plurality of different driving levels associated with the electrical parameter; and defining a plurality of time windows within a switching time period; each time window being associated with a driving level among the plurality of driving levels.

Optionally, the switch circuit may comprise a first power switch coupled to a second power switch; and the method comprises defining a first driving sequence and a second driving sequence; switching the first power switch on by applying sequentially an electrical parameter to the first power switch following the first driving sequence; and switching the second power switch off by applying sequentially an electrical parameter to the second power switch following the second driving sequence.

Optionally, the plurality of driving levels comprises a first driving level associated with an electrical parameter having a first value and a second driving level associated with an electrical parameter having a second value; wherein the second value is lower than the first value.

Optionally, the driving sequence comprises a first time window followed by a second time window, wherein the first time window is associated with the second driving level and the second time window is associated with the first driving level.

Optionally, the driving sequence comprises a first time window followed by a second time window, wherein the first time window is associated with the first driving level and the second time window associated with the second driving level.

Optionally, the power switch comprises a transistor having gate and a source, the transistor being adapted to switch from an open state to a closed state when a gate-source voltage increases from an initial value to a threshold value, and wherein the first time window ends and the second window starts when the gate-source voltage is substantially equal to the threshold value.

Optionally, the power switch comprises a transistor having gate and a source, the transistor being adapted to switch from a closed state to an open state when a gate-source voltage decreases from an initial value to a threshold value, and wherein the first time window ends and the second window starts when the gate-source voltage is substantially equal to the threshold value.

According to a second aspect of the disclosure, there is provided a driver for driving a switch circuit comprising a power switch, the driver being adapted to apply sequentially an electrical parameter to the power switch, based on a driving sequence.

Optionally, the driving sequence comprises a plurality of driving levels, and a plurality of time windows, each time window being associated with a driving level among the plurality of driving levels.

Optionally, the driver comprises a first set of electronic circuits, each circuit among the first set being switchable between a first state wherein the circuit has a first impedance and a second state wherein the circuit has a second impedance, the first impedance being larger than the second impedance; and a first controller coupled to the first set of electronic circuits, wherein the first controller is adapted to switch at least one circuit between the first state and the second state based on the driving sequence.

Optionally, the first controller comprises a first circuit for setting the plurality of time windows and a second circuit for setting the plurality of driving levels.

Optionally, the first set of electronic circuits comprises a set of buffer gate circuits.

Optionally, the driver comprises a buffer control unit coupled to the first circuit and to the second circuit; wherein the buffer control unit is adapted to receive timing information from the first circuit and driving level information from the second circuit and to generate a control signal to control an output of the buffer gate circuits.

Optionally, the driver comprises a second set of electronic circuits, each circuit among the second set being switchable between a first state wherein the circuit has a first impedance and a second state wherein the circuit has a second impedance, the first impedance being larger than the second impedance; and a second controller coupled to the second set of electronic circuits, wherein the second controller is adapted to switch at least one circuit between the first state and the second state based on another driving sequence.

According to a third aspect of the disclosure, there is provided a switching converter, comprising a switch circuit comprising a power switch, and a driver coupled to the switch circuit, the driver being adapted to apply sequentially an electrical parameter to the power switch, based on a driving sequence.

Optionally, the driving sequence comprises a plurality driving levels, and a plurality of time windows, each time window being associated with a driving level among the plurality of driving levels.

Optionally, the switch circuit comprises a first power switch coupled to a second power switch; and the driver is adapted to switch the first power switch on by applying sequentially the electrical parameter to the first power switch following a first driving sequence; and to switch the second power switch off by applying sequentially the electrical parameter to the second power switch following a second driving sequence.

Optionally, the driver comprises a first set of electronic circuits, each circuit among the first set being switchable between a first state wherein the circuit has a first impedance and a second state wherein the circuit has a second impedance, the first impedance being larger than the second impedance; and a first controller coupled to the first set of electronic circuits, wherein the first controller is adapted to switch at least one circuit between the first state and the second state based on the driving sequence.

Optionally, the power switch comprises a transistor having gate and a source, the transistor being adapted to switch between an open state and a close state when a gate-source voltage reaches a threshold voltage, and wherein the driving sequence comprises a first time window associated with a first driving level and a second time window associated with a second driving level, wherein the first time window ends and the second window starts when the gate-source voltage is substantially equal to the threshold voltage.

BRIEF DESCRIPTION OF THE DRAWINGS

The invention is described in further detail below by way of example and with reference to the accompanying drawings, in which.

DESCRIPTION

Figure 1:
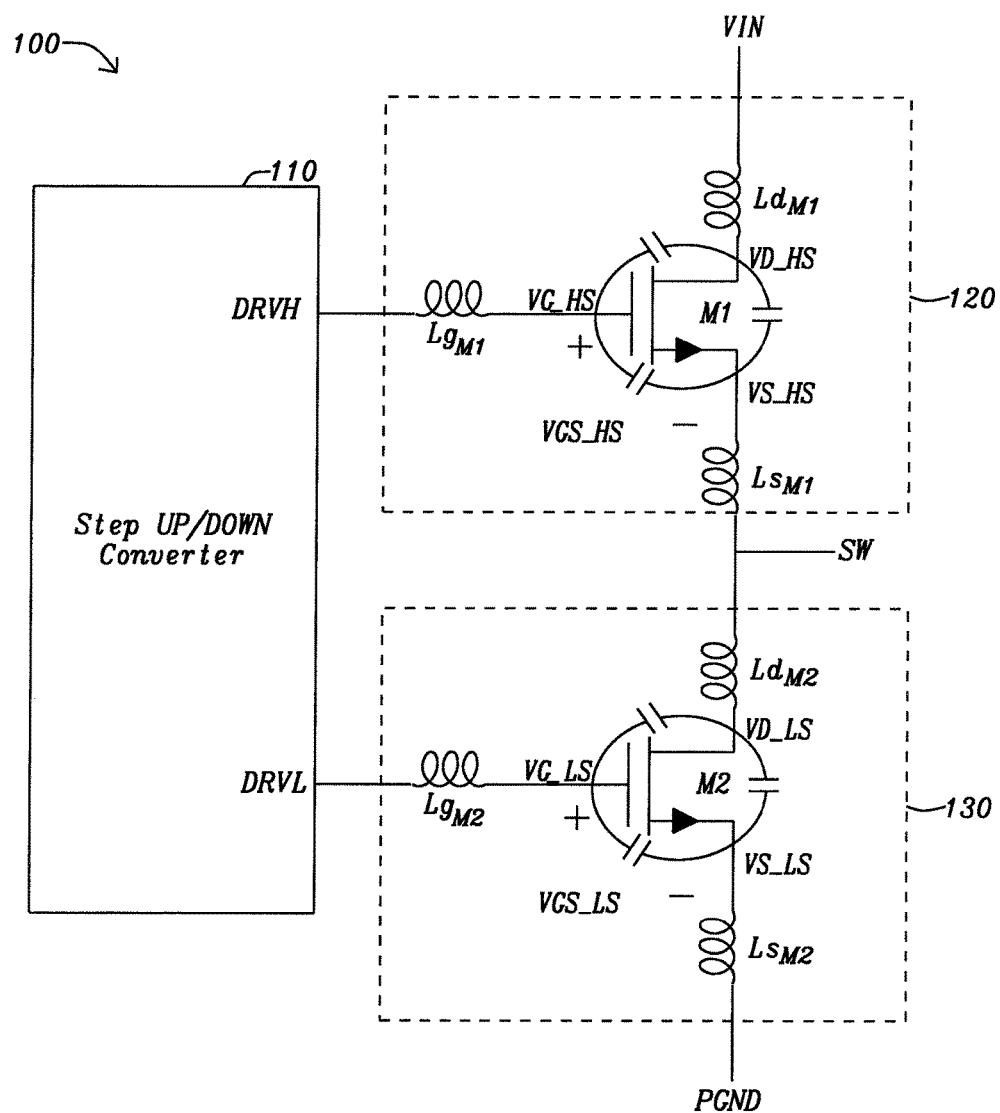
FIG. 1 is a diagram of a switch circuit of a power converter.

FIG. 1 illustrates 100 a driver 110 coupled to a switch circuit provided with a high side power switch M1 120, and a low side power switch M2, 130 in a half-bridge topology. In this example the power switches are N-MOS transistors. The driver 110 has a high side driver connected to a gate of the high side transistor M1 and a low side driver connected to the gate of the low side transistor M2. The high side transistor M1 has a drain connected to an input voltage Vin and a source connected to a switch node SW. The low side transistor M2 has a drain connected to the switch node SW and a source connected to the ground.

Power transistors, and in particular low cost metal-oxide-semiconductor filed-effect transistors, can display relatively large parasitic inductances and capacitances at their gate, source and drain. For example, a gate inductance Lg can be greater than 2 nH, a gate capacitance Cg may be larger than 4 nF. As a result, when the switch node SW varies from a potential Vin to a ground voltage Vgd, unwanted voltage oscillations, also referred to as ringing occur.

These voltage oscillations may result in a short circuit by turning on the transistors M1 and M2 simultaneously. Such an event is more likely to happen for switching regulators operating at high frequencies; for example, above 1 MHz. Incidentally, switching regulators are often operated at higher frequency in order to improve performance. Such improvements in performance may include smaller output voltage ripple and higher output loading supply.

Figure 2:
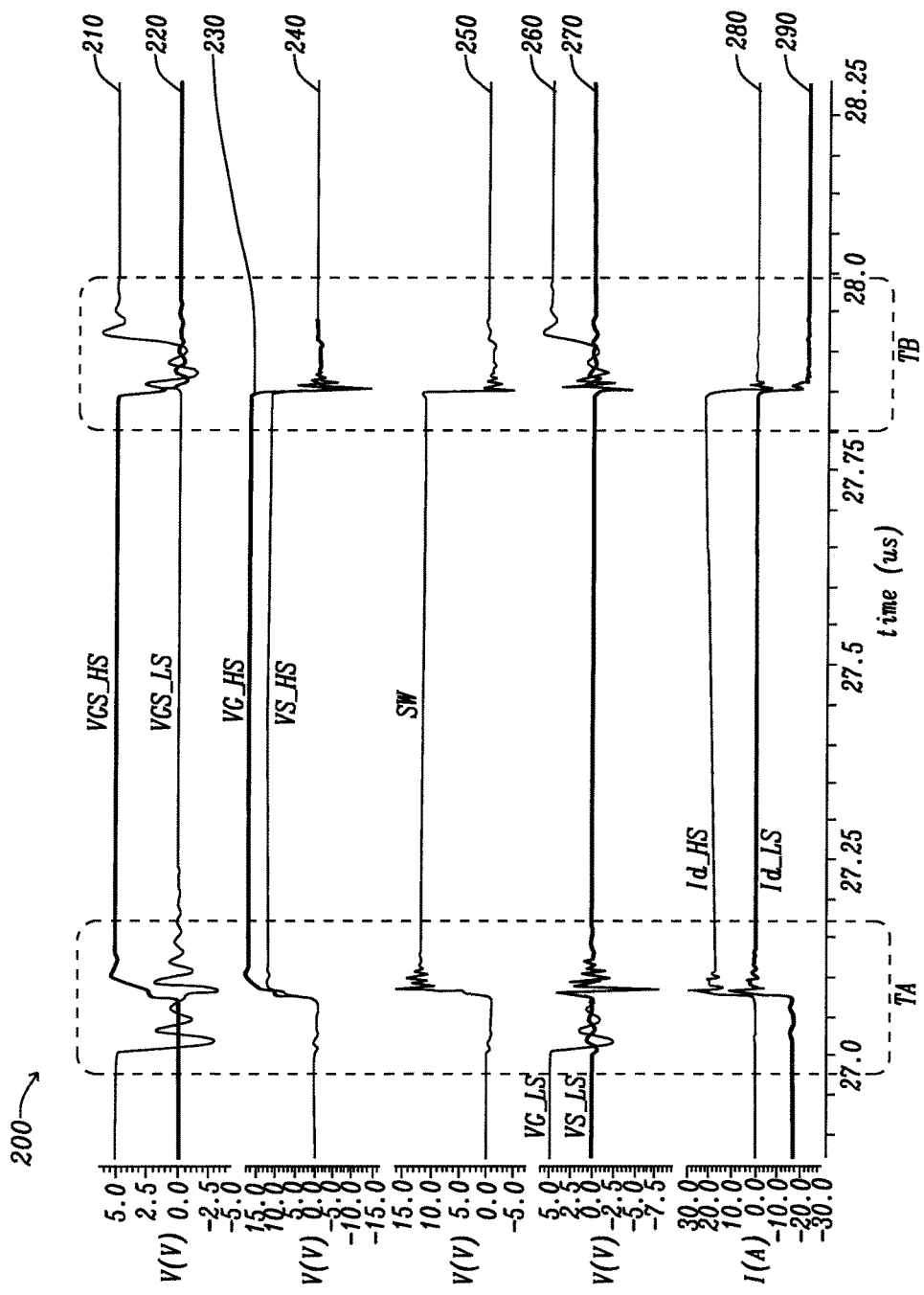
FIG. 2 is a timing chart illustrating the working of the circuit of FIG. 1.

FIG. 2 shows 200 the gate-source voltage profiles VGS_HS, 220, and VGS_LS, 210, of the high side transistor M1, and the low side transistor M2, as a function of time.

Also shown are the gate voltage profile VG_HS, 230 and the source voltage profile VS_HS, 240 of the high side transistor; the gate voltage profile VG_LS, 260 and the source voltage profile VS_LS, 270 of the low side transistor.

Also shown are the drain currents Id_HS, 280, and Id_LS, 290, on the high side transistor and the low side transistor respectively; as well as the voltage at the switch node SW 250.

Around the time period TA, the high side transistor M1 is switched on (closed) while the low side transistor M2 is switched off (open). Around the time period TB, M1 is switched off while M2 is switched on.

Figure 3:
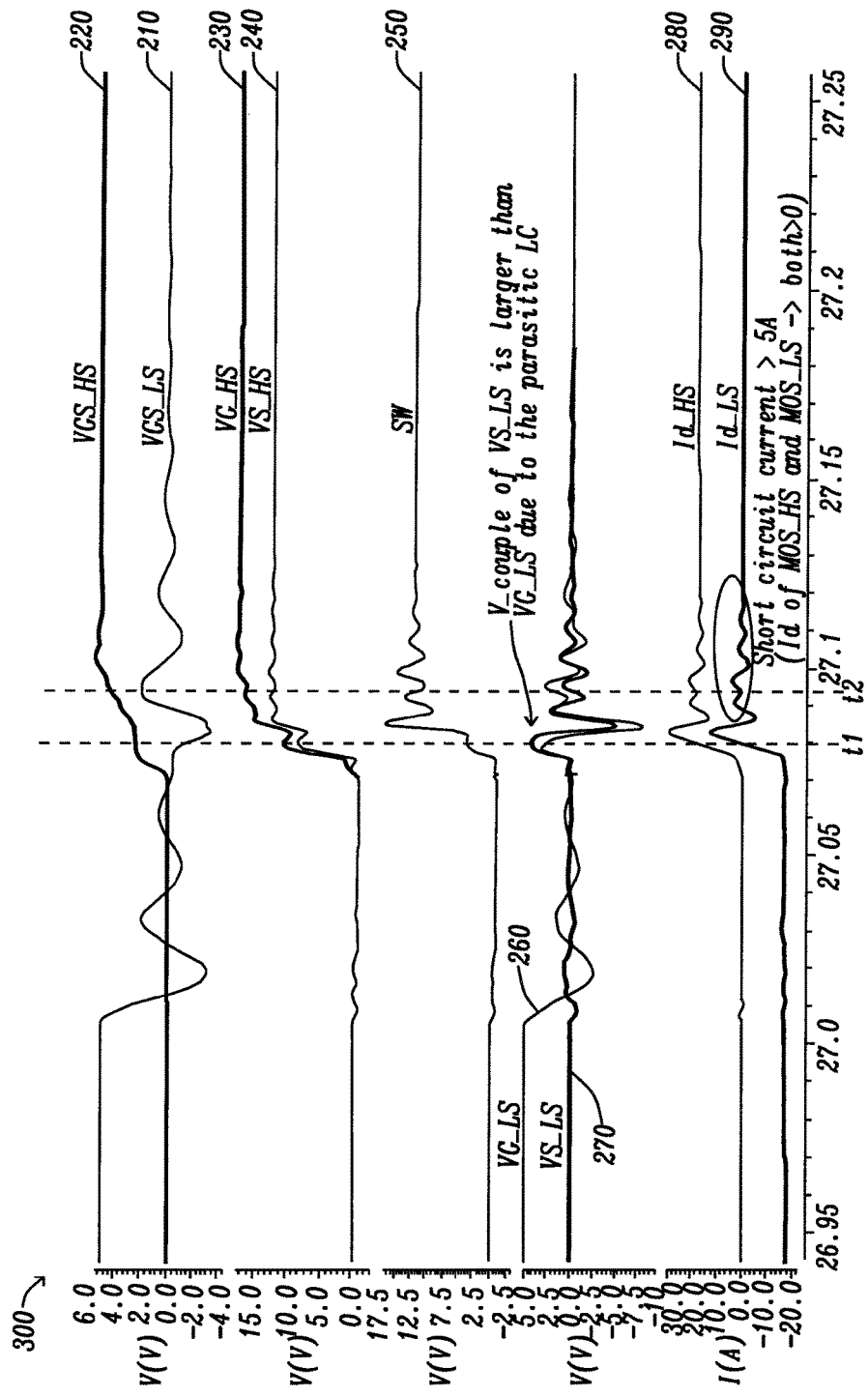
FIG. 3 is a close-up around a switching period of the timing chart of FIG. 2.

FIG. 3 shows 300 a close-up around the time period TA of the profiles of FIG. 2.

When the voltage 250 at node SW increases, both the gate voltage VG_LS, 260, and the source voltage VS_LS, 270 of transistor M2 increase as well. Due to parasitic inductance and capacitance, VS_LS is first larger than VG_LS, then VG_LS is larger than VS_LS. This results in a transient voltage VGS_LS that initially at time t1 decreases then increases to reach a peak value at time t2.

At time t2=27.09 µs, VGS_HS and VGS_LS are both at or above 2V. The threshold voltage Vth corresponds to the minimum voltage at which the transistor can be turned on. In this example, the threshold voltage Vth at or above which the transistors M1 and M2 can be turned on is 1.5 V. As a result, both M1 and M2 are switched on at the same time, leading to a short circuit current greater than 5 A. The parasitic inductances and capacitances associated with M1 and M2 can cause similar voltage oscillations to occur around the time period TB, leading to the generations of short circuit currents. Such short circuit currents reduce the power efficiency of the system.

Figure 4:
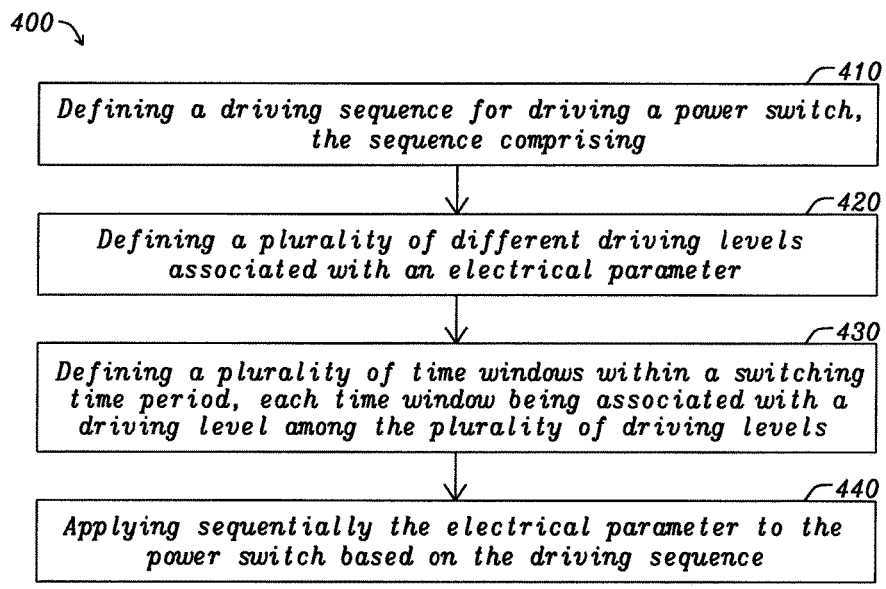
FIG. 4 is a flow diagram of a method for driving a switch circuit.

FIG. 4 shows a flow diagram of a method 400 for driving a switch circuit during a switching time period.

At step 410, a driving sequence is defined for driving a power switch. In this example, the method comprises the step of defining a plurality of different driving levels associated with an electrical parameter, step 420, and the step of defining a plurality of time windows, also referred to as time segments, within a switching time period, step 430.

The driving levels are associated with an electrical parameter, for example a current or a voltage for driving the transistor. Each time window is associated with a driving level among the plurality of driving levels. For example, if the driving sequence has two different driving levels D1 and D2 and five time windows T1, T2, T3, T4 and T5, then the windows T1, T3 and T5 may be associated with level D1 and windows T2 and T4 may be associated with level D2. The number of driving levels and the number of time windows may vary as required. The number of time windows may be 2 or any number greater than 2. For example, the number of time windows can range between 2 and 20. However the number of time windows could be greater than 20. The number of driving levels can vary between 2 and the number of time windows or more.

The duration of each time window can vary between time windows. For example, a first time window can be set to 2 ns and another time window can be set to 10 ns. Therefore, each time window can be set individually.

At step 440 the electrical parameter is applied sequentially to the power switch based on the driving sequence.

When using a switching converter provided with two power switches in a half bridge topology, a driving sequence can be defined for each transistor.

In this case a first power switch is switched on by applying sequentially an electrical parameter to the first power switch following a first driving sequence. While the first power switch is being switched on, the second power switch is switched off. This is achieved by applying sequentially an electrical parameter to the second power switch following a second driving sequence.

The driving sequence or sequences can be chosen to minimise ringing effects while at the same time shortening the rising and/or falling times of VGS. This allows operating the transistors M1 and M2 with a short dead-time.

Therefore, using such a method it is possible to reduce or eliminate the instances of short circuits, while maintaining or even increasing power efficiency.

Figure 5:
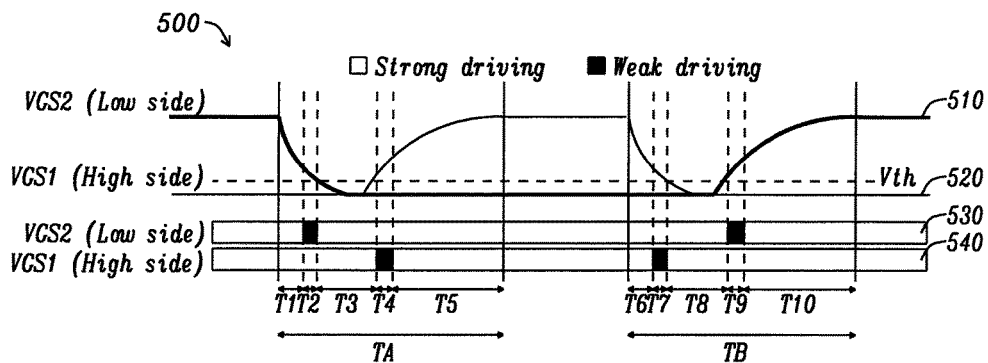
FIG. 5 is a schematic representation of the gate-source voltage profiles of a high side and a low side transistor respectively.

FIG. 5 illustrates 500 the schematic profiles of VGS1 520 and VGS2 510 for the high side transistor M1 and the low side transistor M2 during two switching periods referred to as TA and TB. During the time period TA, M1 is switched on (closed) while M2 is switched off (open). Likewise, during the time period TB, M1 is switched off while M2 is switched on.

FIG. 5 also illustrates a first driving sequence 530 for the low side power switch M2 and a second driving sequence 540 for the high side power switch M1.

A power switch may be driven with a relatively strong driver or a relatively weak driver. A strong driver can deliver enough current or voltage in order to reach a desired voltage or current level relatively quickly. In contrast a weak driver delivers less current or voltage. A weak driver may be used to hold a certain value or to reach a desired value relatively slowly.

The switching time periods TA and TB are each divided in several time segments. In this example, TA is divided in five segments labelled T1, T2, T3, T4 and T5. The switching period TB is also divided in five segments labelled T6, T7, T8, T9 and T10.

Looking first at the high side VGS voltage, it can be observed that during times T1 and T2, VGS_HS remains at a constant initial voltage value, then during times T3, T4 and T5, VGS_HS increases to a target value. During times T1 and T2, a strong driver is used to maintain VGS_HS at the initial voltage value. During time T3, a strong driver is used to increase VGS_HS up to the threshold voltage Vth of M1. This results in a fast rising time. During time T4, a weak driver is used to increase VGS_HS from Vth to a first voltage value. This prevents or reduces noise which could arise from the channel ringing between the drain and the source of the transistor. Then during time T5, a strong driver is used to increase VGS_HS up to a second voltage value, referred to as the target value.

During times T6, T7, and T8 VGS_HS is decreasing from the target value to the initial voltage value, then during times T9, and T10, VGS_HS remains constant at the initial voltage value. During time T6, a strong driver is used to decrease VGS_HS from the second voltage value to a third voltage value. During time T7, a weak driver is used to decrease VGS_HS down to the threshold voltage Vth of M1. Then during time T8, a strong driver is used to decrease VGS_HS down to the initial voltage value. This results in a fast falling time. As VGS_HS is pulled to zero M1 turns off, and VDS_HS is stable. Then during time T9, and T10 the strong driver is used to maintain VGS_HS at the initial voltage value.

Turning to the low side VGS voltage, one can observe that during times T1, T2, and T3 VGS_LS is decreasing from the second voltage value to the initial voltage value, then during times T4, and T5, VGS_LS remains constant at the initial voltage value. During time T1, a strong driver is used to decrease VGS_LS from the second voltage value to the third voltage value. During time T2, a weak driver is used to decrease VGS_LS down to the threshold voltage Vth of M2. Then during time T3, a strong driver is used to decrease VGS_LS down to the initial voltage value. During time T4, and T5 the strong driver is used to maintain VGH_LS at the initial voltage value.

During times T6 and T7, VGS_LS remains at a constant initial voltage value, then during times T8, T9 and T10, VGS_LS increases to the target value. During times T6 and T7, a strong driver is used to maintain VGS_LS at the initial voltage value. During time T8, a strong driver is used to increase VGS_LS up to the threshold voltage Vth of M2. During time T9, a weak driver is used to increase VGS_LS up to the first voltage value. As mentioned above, during time T9, VGS_HS is maintained at the initial voltage value, for example 0V, with a strong driving force. This avoids turning on both M1 and M2 simultaneously. Then during time T10, a strong driver is used to increase the VGH_LS up to the second voltage value. By using a strong driver after the transition ends, it is possible to reduce coupling effects.

Figure 6:
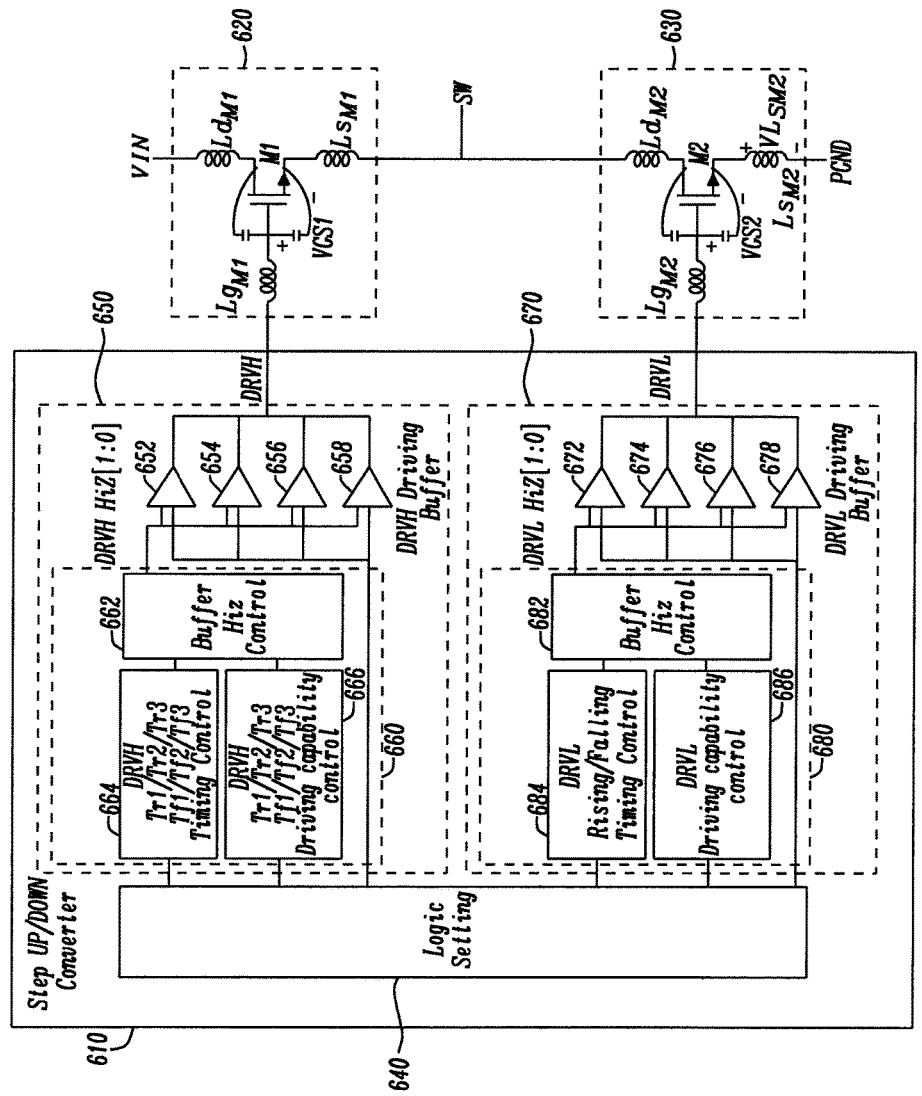
FIG. 6 is a circuit diagram of a driver for driving a switch circuit according to the method of FIG. 4.

FIG. 6 illustrates a circuit diagram 600 of a driver for driving the high side transistor M1 and the low side transistor M2 according to the method of FIG. 4. The driver 610 has a logic setting module 640 coupled to a high side driver 650 for driving transistor M1 and to a low side driver 670 for driving transistor M2.

The high side driver 650 includes a controller 660 coupled to four gate buffer circuits, referred to as buffers 652, 654, 656 and 658. The controller 660 has a first circuit 664, also referred to as timing unit, for setting a plurality of time windows, and a second circuit 666, also referred to as driving unit, for setting a plurality of driving levels. A third circuit 662, referred to as buffer control unit for controlling the buffers, has a first input for receiving timing information from the first circuit 664 and a second input for receiving driving level information from the second circuit 666. Each buffer has a first and a second input and one output. The first input is connected to an output of the buffer control unit 662 and the second input is connected to an output of the logic setting 640.

The low side driver 670 includes a controller 680 coupled to four buffers 672, 674, 676 and 678. The controller 680 has a buffer control unit 682 coupled to a timing unit 684 and to a driving unit 686. Each buffer has a first and a second input and one output. The first input is connected to an output of the buffer control unit 682 and the second input is connected to an output of the logic setting 640.

The timing circuits 664 and 684, and the driving units 666 and 686 may be implemented as memory devices. These circuits may also include a plurality of delay cells for example to define a time window.

In operation, the buffers of the high side driver 650 are controlled by the controller 660 to modify a current sent to the gate of the power switch M1. The timing unit 664 is set with a series of time windows including rising times Tr and falling times Tf. For example, three rising times Tr1, Tr2 and Tr3 may be set with a specific start time and end time, or a start time and a duration time. Likewise, three falling times Tf1, Tf2 and Tf3 may be set with a specific start time and end time, or a start time and a duration time. The driving unit 666 is set with a series of driving levels for each one of the rising times Tr and falling times Tf set in the timing unit 664. For example, the rising time Tr1 may be associated with a strong driving or with a weak driving. The time windows and driving levels may be configurable to suit a variety of power metal oxide semiconductor, MOS, and printed circuit board, PCB, parasitic.

Each driving buffer receives two signals, a first signal referred to as control signal from the buffer control unit 662, and a second signal referred to as input signal from the logic setting 640. The buffer control unit 662 receives the timing information and the driving level information from unit 664 and 666 respectively and generates the control signal. The control signal is used for enabling or disabling the output of the buffer. For example, the control signal may be a logic zero or a logic 1. A logic zero signal can be used to turn off the buffer output resulting in an output state of high impedance. A logic one signal can be used to turn on the output, allowing the buffer to operate normally. The logic setting module 640 receives the timing information and the driving level information from unit 664 and 666 respectively and generates the input signal.

The buffer control unit 662 outputs a time dependent signal allowing sequential driving of the transistor. The buffer control unit 662 may be set to output a value corresponding to a weak driving during a specific time period, and another value corresponding to a strong driving during another time period.

By controlling a number of buffers being switched on it is possible to adjust an output impedance, HIZ, of the driver and therefore the output current delivered by the driver. The greater the number of buffers being switched on, the lower the output impedance and the larger the value of the output current.

For instance, if the output value of the buffer control is set to be DRVH_HIZ[1:0]=11, then only one buffer turns on. The impedance is high and the output current of the driver is low. This corresponds to a weak driving level, also referred to as driving level zero.

If the output value of the buffer control is set to be DRVH_HIZ[1:0]=10, then two buffers turn on, and the output current of the driver increases. This corresponds to a fairly weak driving level, also referred to as driving level one.

If the output value of the buffer control is set to be DRVH_HIZ[1:0]=01, then three buffers turn on, and the output current of the driver increases further. This corresponds to a fairly strong driving level, also referred to as driving level two.

If the output value of the buffer control is set to be DRVH_HIZ[1:0]=00, then four buffers turn on, and the output current of the driver increases yet further. This corresponds to a strong driving level, also referred to as driving level three.

Equally, the buffers of the low side driver 670 are controlled by the controller 680 to modify a current sent to the gate of the power switch M2.

In an alternative embodiment, the buffers are controlled to modify a gate voltage of the transistor. For example, the high side driver 650 may be adapted to control VGS of the high side transistor M1.

Figures 7, 8:
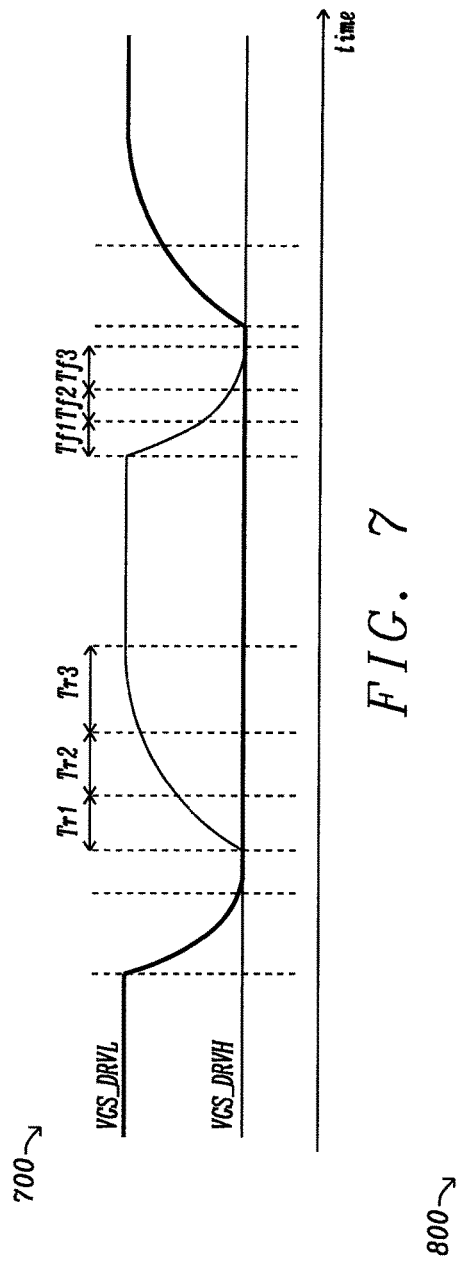
FIG. 7 is a schematic representation of a sequence of time windows.
FIG. 8 is a table listing the durations and driving capabilities associated with the time windows of FIG. 7.

FIG. 7 illustrates an example 700 of the high side transistor M1 and the low side transistor M2 being operated using the sequential driving approach.

The gate source voltage profile VGS of M1 has been split in multiple time segments. The rising time of VGS has been split in 3 segments Tr1, Tr2 and Tr3 also referred to as DRVHr_dly1, DRVHr_dly2, DRVHr_dly3. The falling time of VGS has been split in 3 segments Tf1, Tf2 and Tf3, also referred to as DRVHf_dly1, DRVHf_dly2, DRVHf_dly3.

FIG. 8 lists 800 the durations and the driving levels also referred to as driving capabilities, associated with the time windows Tr1, Tr2, Tr3 and Tf1, Tf2, Tf3 respectively.

The driving capability refers to a number of buffers being turned on. In this example four different settings are available labelled setting 0, setting 1, setting 2 and setting 3. For example, the high side driver may drive a transistor with a driving capability DRVH_drv1, for a rising time Tr1. The setting of DRVH_dry can be set to 0, 1, 2 or 3. As mentioned above, a driving level 0 corresponds to 1 buffer being turned on, a driving level 1 corresponds to 2 buffers being turned on, a driving level 2 corresponds to 3 buffers being turned on and a driving level 3 corresponds to 4 buffers being turned on.

Similarly, the rising time Tr1 may be set to 0, 1, 2, or 3. Referring to the values listed in FIG. 8, if Tr1 is set to 0 the duration is 0 ns, if Tr1 is set to 1 the duration is 2 ns, if Tr1 is set to 2 the duration is 4 ns, if Tr1 is set to 3 the duration is 6 ns. For example, if a first window having a driving level DRVH_drv1, and a rising time Tr1 (DRVH_drv1, Tr1) is set to (2,3), this means that the transistor is driven using 3 buffers during a first rising time of 6 ns.

Figure 9:
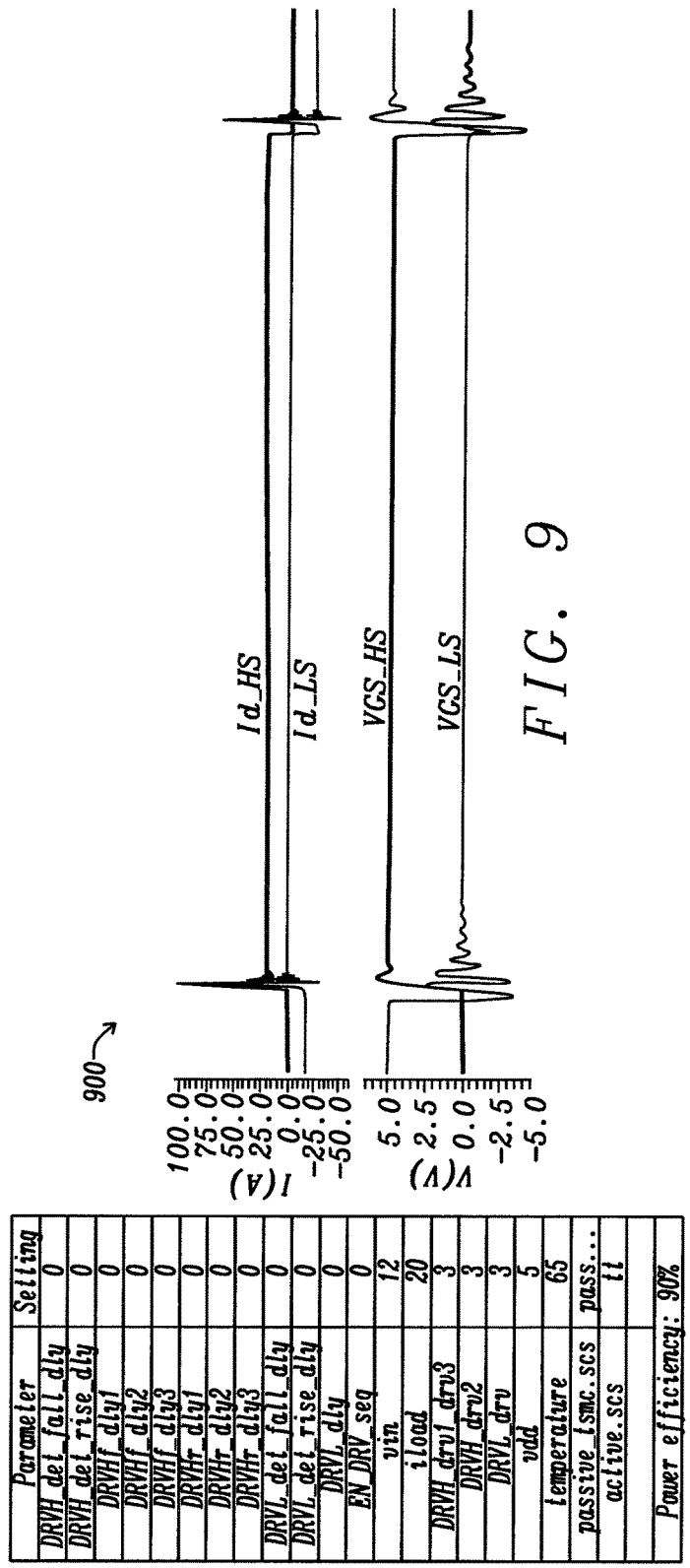
FIG. 9 is a timing chart showing the drain current and the gate-source voltage profiles of the high side and low side transistors using conventional driving.

FIG. 9 shows 900 the drain current and VGS for the high side and low side transistors respectively. In this example the transistors are driven with a constant driving strength over time. The peak drain current Id is greater than 100 A for the high side transistor and greater than 75 A for the low side. Based on simulation results, the power efficiency of the system was estimated at 90%.

Figure 10:
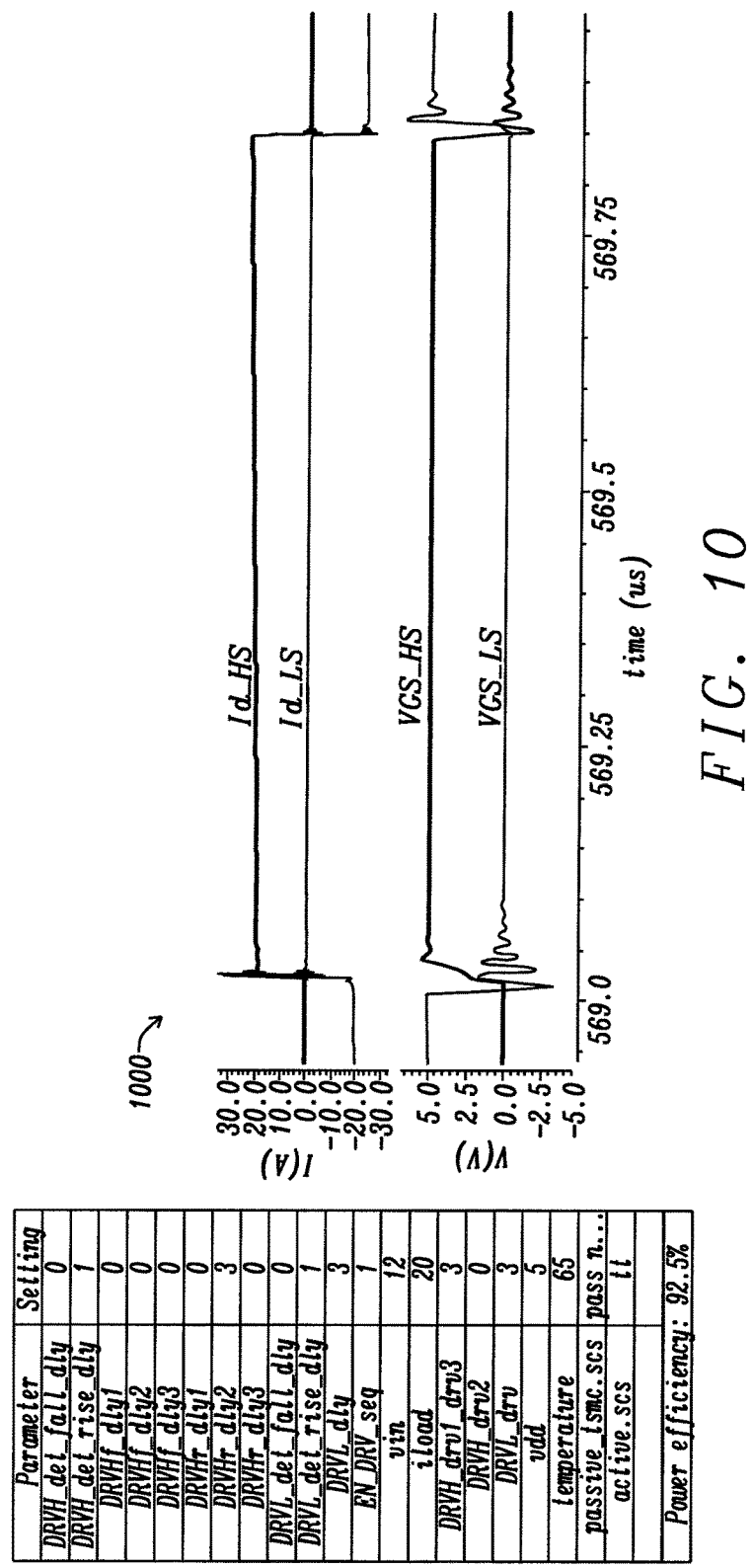
FIG. 10 is a timing chart showing the drain current and gate-source voltage profiles of the high side and low side transistors using sequential driving.

FIG. 10 shows 1000 the drain current and VGS for the high side and low side transistors respectively operated using sequential driving. The high side transistor is driven using the following sequence:

(DRVH_drv1, Tr1)=(3,0) corresponding to 4 buffers ON for 0 ns;
(DRVH_drv2, Tr2)=(0,3) corresponding to 1 buffer ON for 12 ns;
(DRVH_drv3, Tr3)=(3,0) corresponding to 4 buffers ON for 0 ns;
(DRVH_drv1, Tf1)=(3,0) corresponding to 4 buffers ON for 0 ns;
(DRVH_drv2, Tf2)=(0,0) corresponding to 1 buffer ON for 3 ns;
(DRVH_drv3, Tf3)=(3,0) corresponding to 4 buffers ON for 5 ns.

In this case, the peak drain current Id is much lower, in the region of 30 A for the high side transistor and 15 A for the low side. The power efficiency of the system has also increased to 92.5%.

Figure 11A:
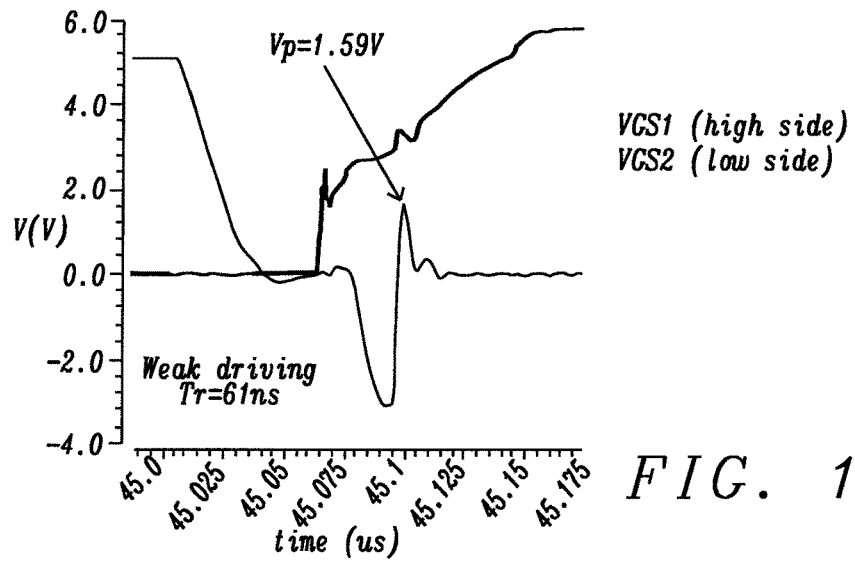
FIG. 11(a) is a simulation of the gate source voltages of a high side transistor around a transition period when the voltage is rising, using weak driving.
Figure 11B:
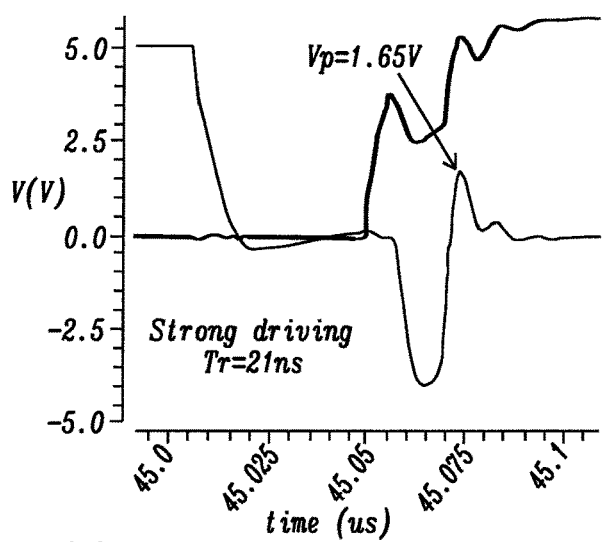
FIG. 11(b) is a simulation of the gate source voltages of a high side transistor around a transition period when the voltage is rising, using strong driving.
Figure 11C:
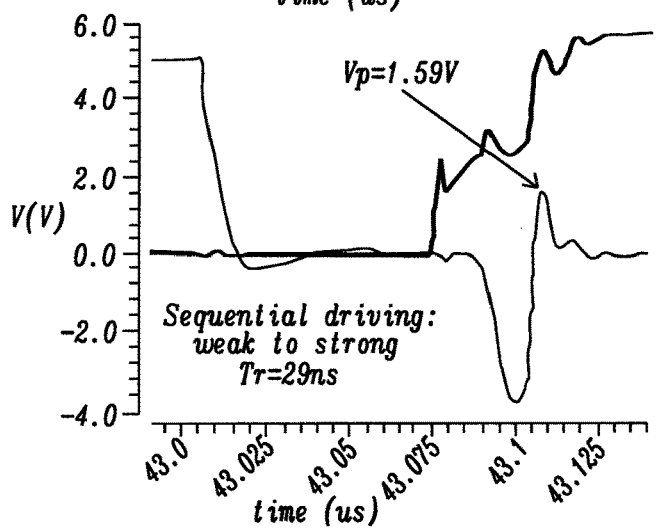
FIG. 11(c) is a simulation of the gate source voltages of a high side transistor around a transition period when the voltage is rising, using sequential driving.

FIG. 11 illustrates a series of simulations of the VGS transients of a high side transistor around a transition period when the voltage is rising. The simulations compare the VGS transients obtained when using weak driving (a), strong driving (b) and sequential driving (c) respectively. By comparing FIGS. 11a and 11b it can be observed that using strong driving allows to shorten the rising time of VGS from 61 ns to 21 ns. However, the cut off voltage Vp has increased from 1.59V to 1.65V. Using sequential driving during the transition period, as shown in FIG. 11c, it is possible to reduce the rising time of VGS to 29 ns while maintaining a low cut off voltage, in this case at 1.59V.

FIG. 12 illustrates a series of simulations of the VGS transients of a high side transistor around a transition period when the voltage is falling. The simulations compare the VGS transients obtained when using weak driving (a), strong driving (b) and sequential driving (c) respectively.

Figure 12A:
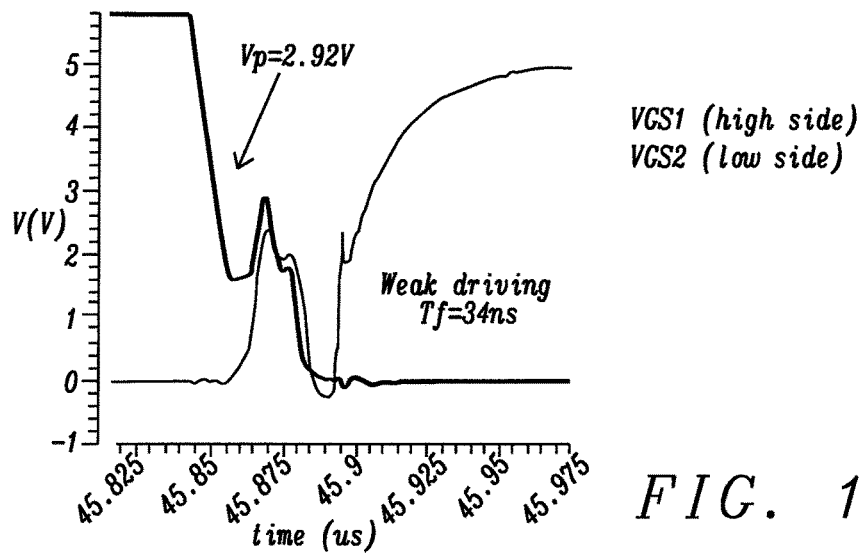
FIG. 12(a) is a simulation of the gate source voltages of a high side transistor around a transition period when the voltage is falling, using weak driving.
Figure 12B:
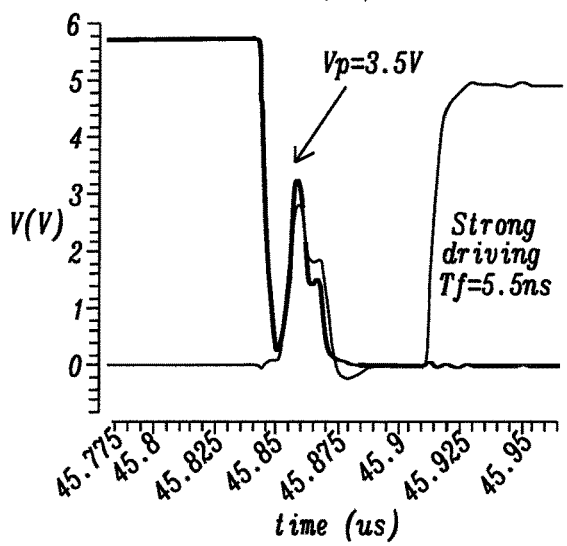
FIG. 12(b) is a simulation of the gate source voltages of a high side transistor around a transition period when the voltage is falling, using strong driving.
Figure 12C:
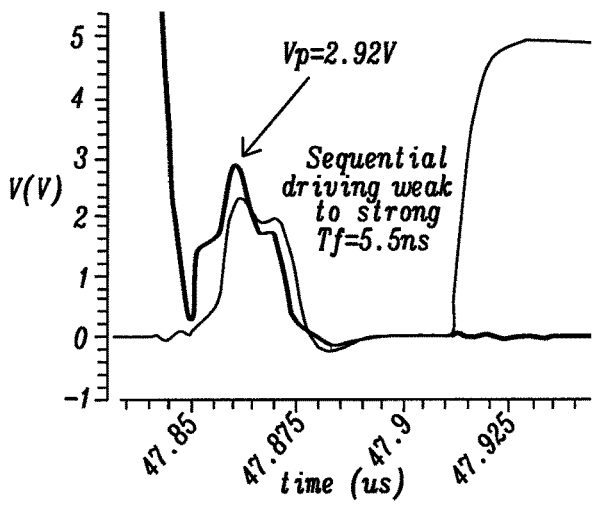
FIG. 12(c) is a simulation of the gate source voltages of a high side transistor around a transition period when the voltage is falling, using sequential driving.

By comparing FIGS. 12a and 12b, it can be observed that using strong driving allows to shorten the falling time of VGS from 34 ns to 5.5 ns. However, the cut off voltage Vp has increased from 2.92V to 3.5V. Using sequential driving during the transition period, as shown in FIG. 12c, it is possible to reduce the falling time of VGS to 5.5 ns while maintaining a low cut off voltage, in this case at 2.92V.

Using sequential driving it is possible to shorten the rising and falling times of the transistor. This allows operating the high side transistor and the low side transistor with a short dead-time. As a result, a switching converter can be operated at higher frequencies. Voltage ringing is also reduced, therefore preventing short circuits and improving power efficiency. In addition, reducing voltage ringing leads to less voltage coupling and a reduction in electromagnetic interferences.

A skilled person will appreciate that variations of the disclosed arrangements are possible without departing from the disclosure. Accordingly, the above description of the specific embodiment is made by way of example only and not for the purposes of limitation. It will be clear to the skilled person that minor modifications may be made without significant changes to the operation described.

What is claimed is:

1. A method of driving a switch circuit comprising a first power switch coupled to a second power switch, and a driver coupled to the switch circuit; the method comprising the steps of:
defining at least one driving sequence;
applying sequentially an electrical parameter to at least one of the first power switch and the second power switch, based on the at least one driving sequence; and
providing the driver with a first set of electronic circuits comprising a plurality of buffers, each buffer of the plurality of buffers being switchable between a first state wherein said each buffer has a first impedance and a second state wherein said each buffer has a second impedance, the first impedance being larger than the second impedance;
wherein the driver comprises a first controller coupled to the first set of electronic circuits, wherein the first controller is adapted to switch at least one buffer of the plurality of buffers between the first state and the second state based on the at least one driving sequence;
wherein said each buffer comprises an output, and wherein the outputs of the buffers are connected to each other;
wherein the at least one driving sequence is adjustable and comprises a plurality of adjustable driving levels, and a plurality of adjustable time windows, each time window of the plurality of adjustable time windows being associated with a driving level among the plurality of adjustable driving levels;
wherein the first controller comprises a first circuit for setting the plurality of adjustable time windows and a second circuit for setting the plurality of adjustable driving levels; and
wherein the driver further comprises a buffer control unit coupled to the first circuit and to the second circuit; wherein the buffer control unit is adapted to receive timing information from the first circuit and driving level information from the second circuit and to generate a control signal to control the output of said each buffer of the plurality of buffers.

2. The method as claimed in claim 1, wherein said defining at least one driving sequence comprises the steps of:
defining the plurality of adjustable driving levels associated with the electrical parameter; and
defining the plurality of adjustable time windows within a switching time period.

3. The method as claimed in claim 2, wherein the plurality of adjustable driving levels comprises a first driving level associated with the electrical parameter having a first value and a second driving level associated with the electrical parameter having a second value; wherein the second value is lower than the first value.

4. The method as claimed in claim 3, wherein the at least one driving sequence comprises a first time window of the plurality of adjustable time windows followed by a second time window of the plurality of adjustable time windows, wherein the first time window is associated with the second driving level and the second time window is associated with the first driving level.

5. The method as claimed in claim 4, wherein at least one of the first power switch and the second power switch comprises a transistor having gate and a source, the transistor being adapted to switch from a closed state to an open state when a gate-source voltage decreases from an initial value to a threshold value, and wherein the first time window of the plurality of adjustable time windows ends and the second window of the plurality of adjustable time windows starts when the gate-source voltage is substantially equal to the threshold value.

6. The method as claimed in claim 3, wherein the at least one driving sequence comprises a first time window of the plurality of adjustable time windows followed by a second time window of the plurality of adjustable time windows, wherein the first time window is associated with the first driving level and the second time window associated with the second driving level.

7. The method as claimed in claim 6, wherein at least one of the first power switch and the second power switch comprises a transistor having gate and a source, the transistor being adapted to switch from an open state to a closed state when a gate-source voltage increases from an initial value to a threshold value, and wherein the first time window of the plurality of adjustable time windows ends and the second window of the plurality of adjustable time windows starts when the gate-source voltage is substantially equal to the threshold value.

8. The method as claimed in claim 1, wherein said defining at least one driving sequence comprises
defining a first driving sequence and a second driving sequence;
switching the first power switch on by applying sequentially the electrical parameter to the first power switch following the first driving sequence; and
switching the second power switch off by applying sequentially the electrical parameter to the second power switch following the second driving sequence.

9. A driver for driving a switch circuit comprising a power switch, the driver being adapted to apply sequentially an electrical parameter to the power switch, based on an adjustable driving sequence; the driver comprising:
a first set of electronic circuits comprising a plurality of buffers, each buffer of the plurality of buffers being switchable between a first state wherein said each buffer has a first impedance and a second state wherein said each buffer has a second impedance, the first impedance being larger than the second impedance; and
a first controller coupled to the first set of electronic circuits, wherein the first controller is adapted to switch at least one buffer of the plurality of buffers between the first state and the second state based on the adjustable driving sequence;
wherein said each buffer comprises an output, and wherein the outputs of the buffers are connected to each other;
wherein the adjustable driving sequence comprises a plurality of adjustable driving levels, and a plurality of adjustable time windows, each time window of the plurality of adjustable time windows being associated with a driving level among the plurality of adjustable driving levels;
wherein the first controller comprises a first circuit for setting the plurality of adjustable time windows and a second circuit for setting the plurality of adjustable driving levels;
the driver further comprising a buffer control unit coupled to the first circuit and to the second circuit; wherein the buffer control unit is adapted to receive timing information from the first circuit and driving level information from the second circuit and to generate a control signal to control the output of said each buffer of the plurality of buffers.

10. The driver as claimed in claim 9, comprising:
a second set of electronic circuits comprising a plurality of buffers, each buffer of the plurality of buffers being switchable between a first state wherein said each buffer has a first impedance and a second state wherein said each buffer has a second impedance, the first impedance being larger than the second impedance; and
a second controller coupled to the second set of electronic circuits, wherein the second controller is adapted to switch at least one buffer of the plurality of buffers of said second set of electronic circuits between the first state and the second state based on another adjustable driving sequence.

11. A switching converter, comprising:
a switch circuit comprising a first power switch coupled to a second power switch, and
a driver coupled to the switch circuit, the driver being adapted to apply sequentially an electrical parameter to at least one of the first power switch and the second power switch, based on at least one adjustable driving sequence; the driver comprising:
a first set of electronic circuits comprising a plurality of buffers, each buffer of the plurality of buffers being switchable between a first state wherein said each buffer has a first impedance and a second state wherein said each buffer has a second impedance, the first impedance being larger than the second impedance; and
a first controller coupled to the first set of electronic circuits, wherein the first controller is adapted to switch at least one buffer of the plurality of buffers between the first state and the second state based on the at least one adjustable driving sequence;
wherein said each buffer comprises an output, and wherein the outputs of the buffers are connected to each other;
wherein the at least one adjustable driving sequence comprises a plurality of adjustable driving levels, and a plurality of adjustable time windows, each time window of the plurality of adjustable time windows being associated with a driving level among the plurality of adjustable driving levels;
wherein the first controller comprises a first circuit for setting the plurality of adjustable time windows and a second circuit for setting the plurality of adjustable driving levels;
the driver further comprising a buffer control unit coupled to the first circuit and to the second circuit; wherein the buffer control unit is adapted to receive timing information from the first circuit and driving level information from the second circuit and to generate a control signal to control the output of said each buffer of the plurality of buffers.

12. The switching converter as claimed in claim 11, wherein said at least one adjustable driving sequence comprises a first driving sequence and a second driving sequence, and wherein the driver is adapted to switch the first power switch on by applying sequentially the electrical parameter to the first power switch following the first driving sequence; and to switch the second power switch off by applying sequentially the electrical parameter to the second power switch following the second driving sequence.

13. The switching converter as claimed in claim 11, wherein at least one of the first power switch and the second power switch comprises a transistor having gate and a source, the transistor being adapted to switch between an open state and a close state when a gate-source voltage reaches a threshold voltage, and wherein the at least one adjustable driving sequence comprises a first time window of the plurality of adjustable time windows associated with a first driving level of the plurality of adjustable driving levels and a second time window of the plurality of adjustable time windows associated with a second driving level of the plurality of adjustable driving levels, wherein the first time window ends and the second window starts when the gate-source voltage is substantially equal to the threshold voltage.

\* \* \* \* \*